(12) United States Patent
Huang et al.

(10) Patent No.: US 11,792,973 B2
(45) Date of Patent: Oct. 17, 2023

(54) STORAGE DEVICE AND FORMING METHOD HAVING A STRIP-SHAPED BITLINE CONTACT STRUCTURE

(71) Applicant: CHANGXIN MEMORY TECHNOLOGIES, INC., Hefei (CN)

(72) Inventors: Juanjuan Huang, Hefei (CN); Lingxiang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 252 days.

(21) Appl. No.: 17/444,908

(22) Filed: Aug. 11, 2021

(65) Prior Publication Data

US 2022/0037330 A1    Feb. 3, 2022

Related U.S. Application Data

(63) Continuation of application No. PCT/CN2021/100200, filed on Jun. 15, 2021.

(30) Foreign Application Priority Data

Jul. 28, 2020   (CN) .......................... 202010737259.X

(51) Int. Cl.
*H10B 12/00* (2023.01)

(52) U.S. Cl.
CPC ........... *H10B 12/34* (2023.02); *H10B 12/053* (2023.02); *H10B 12/482* (2023.02); *H10B 12/485* (2023.02)

(58) Field of Classification Search
CPC .... H10B 12/053; H10B 12/34; H10B 12/482; H10B 12/485

USPC .......................................... 257/907; 438/262
See application file for complete search history.

(56) References Cited

U.S. PATENT DOCUMENTS

| 7,291,560 | B2 | 11/2007 | Parascandola |
| 2002/0196651 | A1 | 12/2002 | Weis |
| 2020/0203353 | A1 | 6/2020 | Liu |
| 2021/0350834 | A1* | 11/2021 | Ke .......................... G11C 5/063 |

FOREIGN PATENT DOCUMENTS

| CN | 106992156 A | 7/2017 |
| CN | 107425072 A | 12/2017 |
| CN | 208189569 U | 12/2018 |
| CN | 109148273 A | 1/2019 |

(Continued)

OTHER PUBLICATIONS

Hong Xiao, "3D IC Devices, Technologies, and Manufacturing", SPIE Press Bellingham, Washington USA, 2016.

(Continued)

*Primary Examiner* — Hoai V Pham
(74) *Attorney, Agent, or Firm* — SYNCODA LLC; Feng Ma

(57) ABSTRACT

A method for forming a memory device includes: after a hard mask layer is formed on a semiconductor substrate, a plurality of parallel mask patterns extending along a third direction are formed on the semiconductor substrate by adopting a self-alignment multi-pattern process, an opening is provided between the adjacent mask patterns, and the opening exposes surfaces of a plurality of drain regions and corresponding isolation layers in the third direction.

20 Claims, 22 Drawing Sheets

(56) References Cited

FOREIGN PATENT DOCUMENTS

| | | |
|---|---|---|
| CN | 208706648 U | 4/2019 |
| CN | 109979939 A | 7/2019 |
| CN | 109979940 A | 7/2019 |
| CN | 211017081 U | 7/2020 |
| KR | 20170042430 A | 4/2017 |

OTHER PUBLICATIONS

International Search Report in the international application No. PCT/CN2021/100200, dated Sep. 17, 2021.

* cited by examiner

STORAGE DEVICE AND FORMING METHOD HAVING A STRIP-SHAPED BITLINE CONTACT STRUCTURE

CROSS-REFERENCE TO RELATED APPLICATIONS

This is a continuation of International Patent Application No. PCT/CN2021/100200 filed on Jun. 15, 2021, which claims priority to Chinese patent application No. 202010737259.X filed on Jul. 28, 2020. The disclosures of these applications are hereby incorporated by reference in their entirety.

BACKGROUND

A Dynamic Random-Access Memory (DRAM) is a common semiconductor memory device in a computer and is composed of many memory units. Each memory unit includes a capacitor and a transistor. A gate of the transistor is connected with a word line, a drain is connected with a bitline, and a source is connected with the capacitor. A voltage signal on the word line can control the transistor to be turned on and off. Further, data information stored in the capacitor is read through the bitline, or the data information is written into the capacitor through the bitline for storage.

SUMMARY

The disclosure relates generally to the field of memory technologies, and more specifically to a semiconductor device and a forming method therefor.

According to multiple embodiments, the first aspect of the present application provides a method for forming a memory device, including the following operations.

A semiconductor substrate is provided. A plurality of discrete active regions extending along a first direction are formed in the semiconductor substrate. The plurality of active regions are isolated by an isolation layer. Two parallel word lines extending along a second direction are formed in each active region and the corresponding isolation layer. The two word lines divide each active region into a drain region located between the two word lines and source regions located outside of the word lines respectively. A first acute angle is provided between the first direction and the second direction.

A plurality of parallel mask patterns extending along a third direction are formed on the semiconductor substrate by adopting a self-alignment multi-pattern process. An opening is provided between the adjacent mask patterns. The opening exposes the surfaces of the plurality of drain regions and the corresponding isolation layers in the third direction.

Using the plurality of parallel mask patterns as masks, the drain region and the corresponding isolation layer are etched along the opening to form a plurality of parallelly distributed trenches in the drain region and the corresponding isolation layer.

The trench is filled with a conductive layer to form a strip-shaped bitline contact structure.

The strip-shaped bitline contact structure is broken to form a plurality of bitline contact blocks connected with corresponding drain regions.

A bitline connecting the plurality of bitline contact blocks is formed along a direction perpendicular to the second direction.

According to multiple embodiments, the second aspect of the present application provides a memory device formed by adopting the foregoing method.

The memory device includes: a semiconductor substrate, wherein a plurality of discrete active regions extending along a first direction are formed in the semiconductor substrate. The plurality of active regions are isolated by an isolation layer. Two parallel word lines extending along a second direction are formed in each active region and the corresponding isolation layer. Each active region is divided by the two word lines into a drain region located between the two word lines and source regions respectively located outside of the word lines. A first acute angle is provided between the first direction and the second direction.

A plurality of parallel mask patterns extending along a third direction are formed on the semiconductor substrate. The mask pattern is formed by adopting a self-alignment multi-pattern process. An opening is provided between the adjacent mask patterns. The opening exposes the surfaces of a plurality of drain regions and the corresponding isolation layers in the third direction. The mask patterns serve as masks when the drain region and the corresponding isolation layer are etched subsequently to form a plurality of parallelly distributed trenches in the drain region and the corresponding isolation layer.

DETAILED DESCRIPTION

In a manufacturing process of the DRAM, a Litho-Etch-Litho-Etch (LELE) Double Pattern (DP) technology can be adopted to form a bitline contact region or Bitline Contact (BLC) block (a first pattern is formed through one-time photolithography and one-time etching, a second pattern is formed through one photolithography and one-time etching, and the first pattern and the second pattern together serve as an etching mask when forming the BLC block). However, the LELE DP technology has very strict requirements on the accuracy of overprinting. As the size is further reduced, it is difficult to manufacture the bitline contact region or bitline contact block of relatively small size using the LELE DP technology and an edge of a formed contact block pattern is relatively rough, affecting the performance of a device.

As such, it can be difficult to manufacture a bitline contact region or bitline contact block with relatively small size by using a related Litho-Etch-Litho-Etch Double Pattern (LELE DP) technology and an edge of a formed contact block pattern is relatively rough, therefore affecting the performance of a device, and increasing the cost of a process.

For this purpose, an embodiment of the disclosure provides a memory device and a method for forming thereof. According to the method, a plurality of parallel mask patterns extending in a third direction are formed on a semiconductor substrate by adopting a self-alignment multi-pattern process. An opening is provided between the adjacent mask patterns. The opening exposes surfaces of a drain region and a corresponding isolation layer in the third direction. When the mask pattern is formed by adopting the self-alignment multi-pattern process, a width or feature size of the opening between the adjacent mask patterns can be relatively small and the surface roughness is relatively low. When the drain region is subsequently etched along the opening to form a trench, the width or feature size of the trench will also be relatively small correspondingly and the surface roughness will be relatively low. Therefore, the width or feature size of a bitline contact structure formed in the trench will also be relatively small and the surface roughness will be relatively low. Therefore, the performance of the memory device is improved.

To further clarify the above objects, features and advantages of the embodiment of the disclosure, the detailed description of the disclosure is illustrated below in detail in combination with the accompanying drawings. When the embodiment of the disclosure is described in detail, for the sake of illustration, schematic diagrams are not locally enlarged according to general scale, are merely exemplary, and are not intended to limit the protection scope of the embodiment of the disclosure. In addition, three-dimensional space size of length, width and depth should be included in actual manufacturing.

Figure 1:
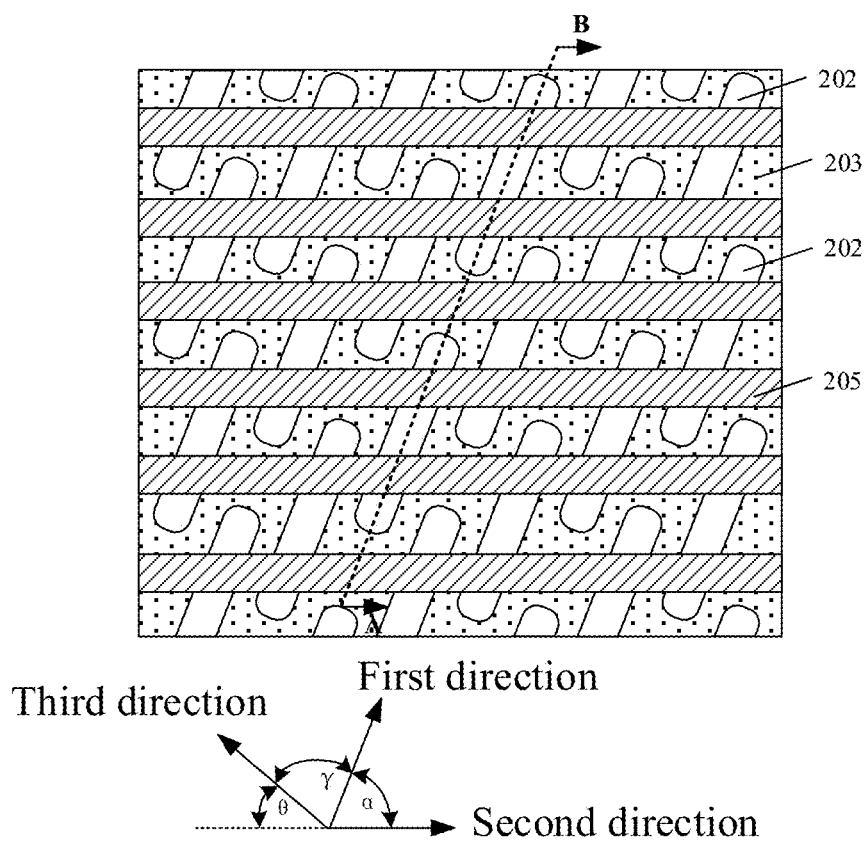
FIG. 1 is a first structural schematic diagram of a procedure for forming memory of an embodiment of the disclosure.
Figure 2:
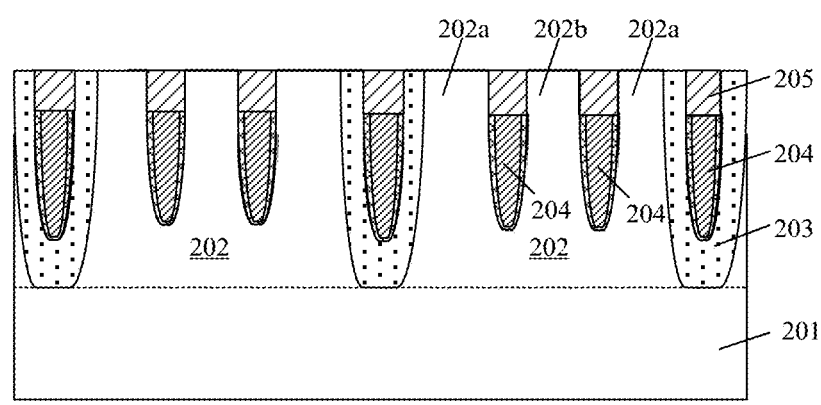
FIG. 2 is a second structural schematic diagram of a procedure for forming memory of an embodiment of the disclosure.

Referring to FIG. 1 and FIG. 2, FIG. 2 is a schematic diagram of a cross-sectional structure of FIG. 1 along a direction of a cutting line AB. The semiconductor substrate 201 is provided. A plurality of discrete active regions 202 extending along a first direction are formed in the semiconductor substrate 201. The plurality of active regions 202 are isolated by an isolation layer 203. Two parallel word lines 204 extending along a second direction are formed in each active region 202 and the corresponding isolation layer 203 (referring to FIG. 2, only an isolation protective layer 205 covering a surface of the word line 204 is shown in FIG. 1). Each active region 202 is divided by the two word lines 204 into a drain region 202b located between the two word lines 204 and source regions 202a located outside of the word lines 204 respectively. A first acute angle α is provided between the first direction and the second direction.

Material of the semiconductor substrate 201 can be silicon (Si), germanium (Ge), or silicon germanium (GeSi), silicon carbide (SiC), may also be Silicon-on-Insulator (SOI) and germanium-on-insulator (GOI), or may also be other materials, for example, group III-V compounds, for example, gallium arsenide, etc. In the embodiment, the material of the semiconductor substrate 201 is silicon. Certain impurity ions are doped in the semiconductor substrate as required, and the impurity ions can be N-type impurity ions or P-type impurity ions. In one embodiment, the doping includes well region doping and source and drain region doping.

In one embodiment, a forming procedure of the active region 202 and the isolation layer 203 is: a first mask layer (not shown in the figure) is formed on the semiconductor substrate 201, a plurality of parallelly distributed first mask openings being provided in the first mask layer; using the first mask layer as a mask, the semiconductor substrate 201 is etched along the first mask opening to form a plurality of discrete strip-shaped active regions in the semiconductor substrate 201, a first trench being provided between the adjacent strip-shaped active regions; the strip-shaped active region is etched to form a plurality of second trenches in the strip-shaped active region, each strip-shaped active region being segmented into a plurality of active regions 202 by the second trench; and the first trench and the second trench are filled with isolation material to form an isolation layer 203. The material of the isolation layer 203 can be silicon oxide or other suitable isolation material (in other embodiments, the first trench can be filled with the isolation material first to form a first isolation layer, and after the first isolation layer is formed, the strip-shaped active region is etched to form a plurality of second trenches in the strip-shaped active region; and then the second trench is filled with the isolation material to form a second isolation layer, the first isolation layer and the second isolation layer forming the isolation layer). It is to be noted that in FIG. 2, to facilitate the distinction between the active region 202 and the semiconductor substrate 201, the active region 202 and the semiconductor substrate 201 are separated by a dotted line. In the embodiment, the plurality of active regions 202 are staggered along a first direction in the semiconductor substrate 201.

In other embodiments, the active region 202 can be formed by an epitaxial process or other suitable processes.

A word line dielectric layer is also formed between the word line 204 and the semiconductor substrate 201. In one embodiment, the forming procedure of the word line 204 is: a mask layer (not shown in the figure) covering the active region 202 and the isolation layer 203 is formed; a plurality of openings extending along the second direction are formed in the mask layer, each opening correspondingly exposing a part of the surfaces of the plurality of active regions 202 and the isolation layer 203 between the active regions 202, two openings being correspondingly provided on each active region, and each active region 202 being divided by the two openings into a drain region 202b located between the two word lines 204 and source regions 202a located outside of the word lines 204 respectively; the active region 202 and the isolation layers on both sides of the active region 202 are etched along the opening to form two word line trenches in each of the active region 202 and the isolation layers 203 on both sides of the active region 202; the word line dielectric layer is formed on a side surface and a bottom surface of the word line trench; and the word line 204 filling the word line trench is formed on the word line dielectric layer, the surface of the word line 204 being lower than the surfaces of the source region 202a and the drain region 202b.

The first acute angle α is presented between the active region (the first direction) and the word line (second direction). In one embodiment, the first acute angle α ranges from 60 degrees to 75 degrees.

In one embodiment, the material of the word line dielectric layer can be silicon oxide or a high-K dielectric material, and the material of the word line 204 can be polysilicon or metal.

In one embodiment, the isolation protective layer 205 is formed on the surface of the word line 204 first. The surface of the isolation protective layer 205 can be flush with the surface of the semiconductor substrate 201 or slightly higher or slightly lower than the surface of the semiconductor substrate 201. The isolation protective layer 205 protects the word line from being exposed by etching when the hard mask layer is formed on the semiconductor substrate 201, the opening is formed in the hard mask layer and the trench is formed in the drain region subsequently. Therefore, leakage or a short circuit between the Bitline Contact (BLC) block formed in the trench and the word line is prevented. When the trench is formed, even if the position of the trench is partially shifted, the isolation protective layer 205 can be used to define the position of the opening, therefore the bottom of the opening can still expose the surface of the corresponding drain region. Therefore, the trench can be formed in the drain region and the bitline contact block can be formed in the trench. The material of the isolation protective layer 205 is different from that of the bottommost layer of the subsequently formed hard mask layer. In one embodiment, the material of the isolation protective layer 205 can be silicon nitride.

Figure 14:
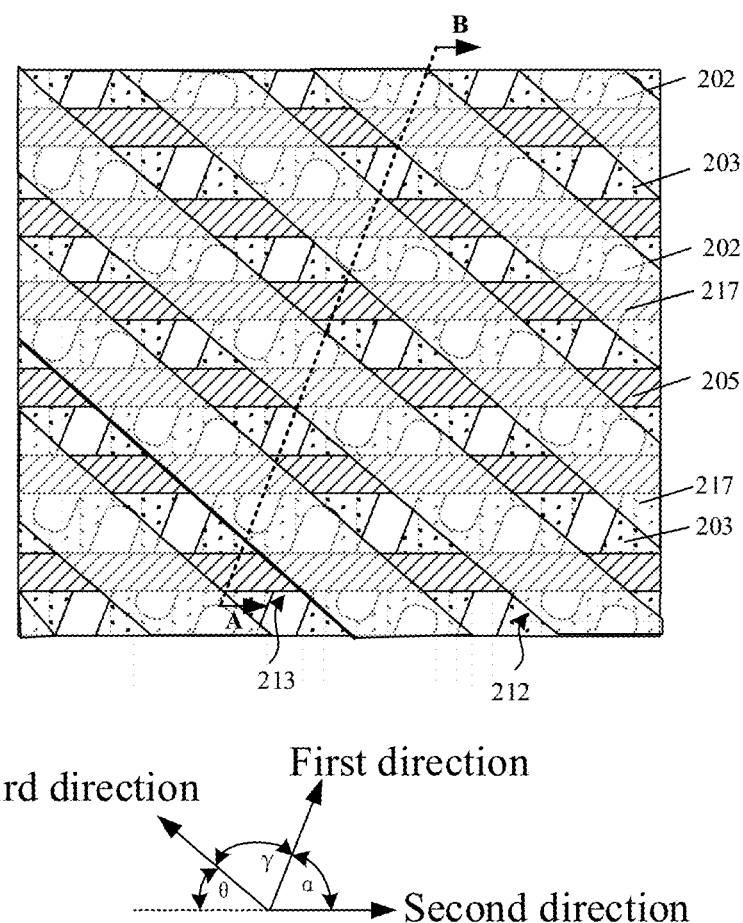
FIG. 14 is a fourteenth structural schematic diagram of a procedure for forming memory of an embodiment of the disclosure.
Figure 15:
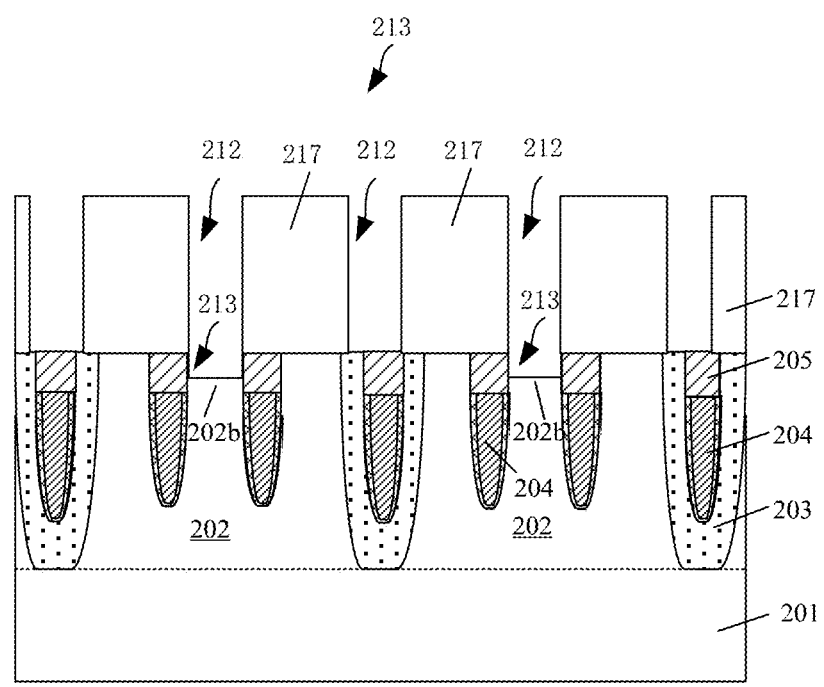
FIG. 15 is a fifteenth structural schematic diagram of a procedure for forming memory of an embodiment of the disclosure.

Referring to FIG. 14 and FIG. 15, FIG. 15 is a schematic diagram of a cross-sectional structure of FIG. 14 along a direction of a cutting line AB. A plurality of parallel mask patterns 217 extending along the third direction are formed on the semiconductor substrate 201 by adopting the self-alignment multi-pattern process, the opening 212 is provided between the adjacent mask patterns 217, and the opening 212 exposing the surfaces of the plurality of drain regions 202b and the corresponding isolation layers 203 (and the isolation protective layer 205) in the third direction.

A specific procedure of forming the plurality of parallel mask patterns 217 extending in the third direction on the semiconductor substrate 201 by adopting the self-alignment multi-pattern process is described in detail in combination with FIG. 3 to FIG.14.

Figure 3:
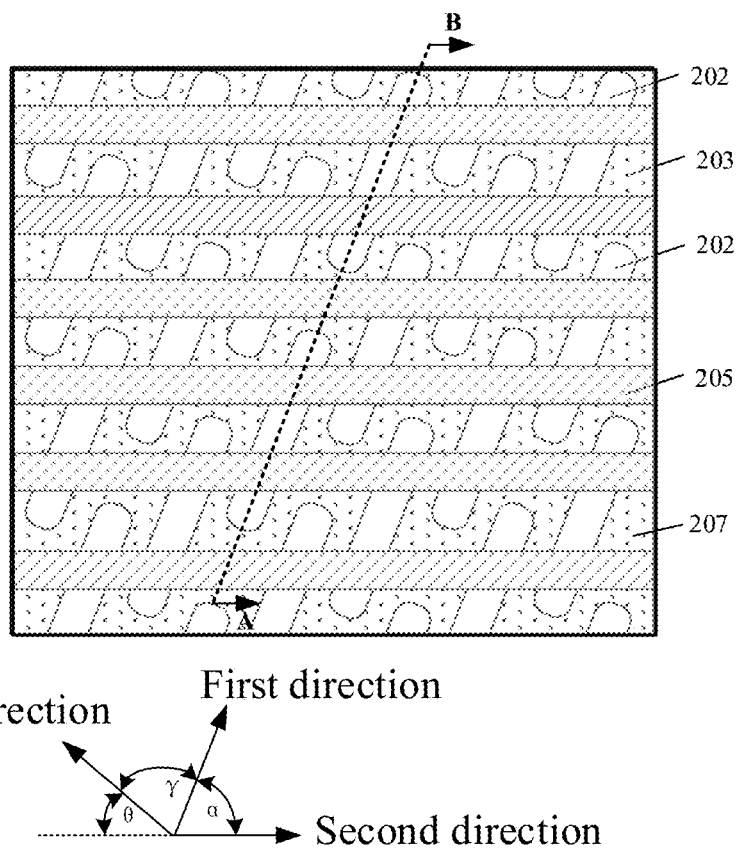
FIG. 3 is a third structural schematic diagram of a procedure for forming memory of an embodiment of the disclosure.
Figure 4:
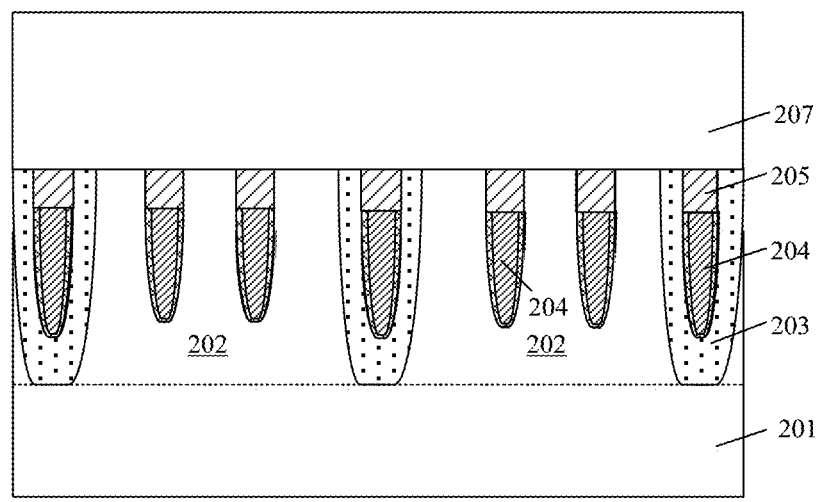
FIG. 4 is a fourth structural schematic diagram of a procedure for forming memory of an embodiment of the disclosure.

Referring to FIG. 3 and FIG. 4, FIG. 3 is performed based on FIG. 1, and FIG. 4 is a schematic diagram of a cross-sectional structure of FIG. 3 along a direction of a cutting line AB. A hard mask layer 207 is formed on the semiconductor substrate 201.

The hard mask layer 207 can be a single-layer or multi-layer stacked structure. In the embodiment, the hard mask layer 207 is the multi-layer stacked structure. The hard mask layer 207 may include a silicon oxide layer, a silicon nitride layer located on the silicon oxide layer, a polysilicon layer located on the silicon nitride layer, a silicon oxide layer located on the polysilicon layer, and a silicon nitride layer located on the silicon oxide layer.

Figure 5:
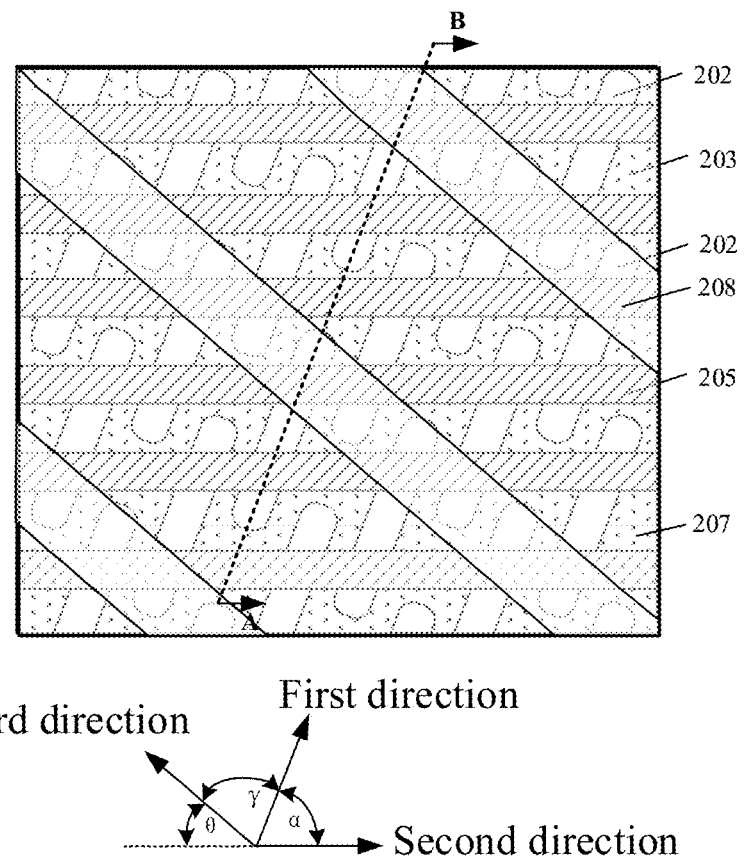
FIG. 5 is a fifth structural schematic diagram of a procedure for forming memory of an embodiment of the disclosure.
Figure 6:
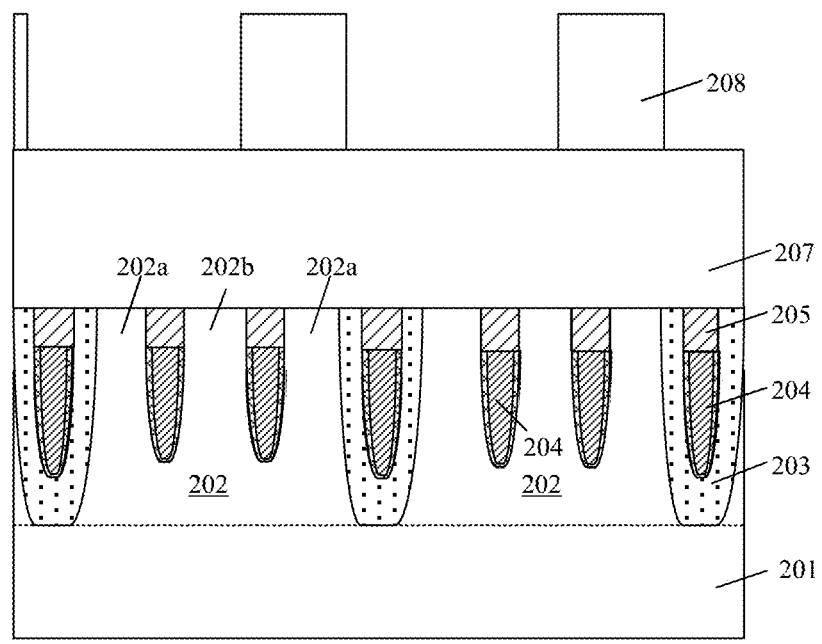
FIG. 6 is a sixth structural schematic diagram of a procedure for forming memory of an embodiment of the disclosure.

Referring to FIG. 5 and FIG. 6, FIG. 5 is performed based on FIG. 3, and FIG. 6 is a schematic diagram of a cross-sectional structure of FIG. 5 along a direction of a cutting line AB. A plurality of parallel first patterns 208 extending in the third direction are formed on the hard mask layer 207.

The plurality of the first patterns are separated and parallel to each other. One first pattern 208 is located on one source region 202a (for example, the source region in the positive direction of the first direction in each active region) of the plurality of active regions 202 in the third direction and the word line adjacent to the source region. The other source region of the active region and the corresponding word line are not covered by the first pattern 208.

The material of the first pattern 208 is different from that of the subsequently formed sidewall material layer. The material of the first pattern 208 can be one or more of silicon nitride, silicon oxynitride, silicon carbonitride, polysilicon, silicon oxide, amorphous silicon, and amorphous carbon. In the embodiment, the material of the first pattern 208 is silicon nitride.

In one embodiment, the procedure of forming the first pattern 208 includes: a first pattern material layer is formed on the hard mask layer 207; a patterned photoresist layer is formed on the first pattern material layer; using the patterned photoresist layer as a mask, the first pattern material layer is etched, and a plurality of parallel first patterns 208 extending along the third direction are formed on the hard mask layer 207.

Figure 7:
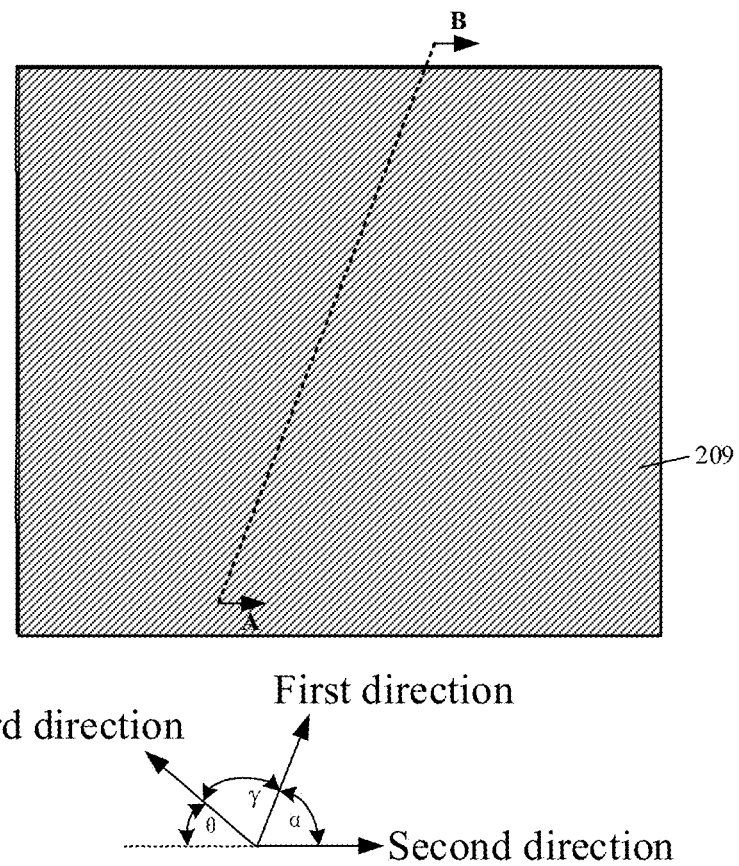
FIG. 7 is a seventh structural schematic diagram of a procedure for forming memory of an embodiment of the disclosure.
Figure 8:
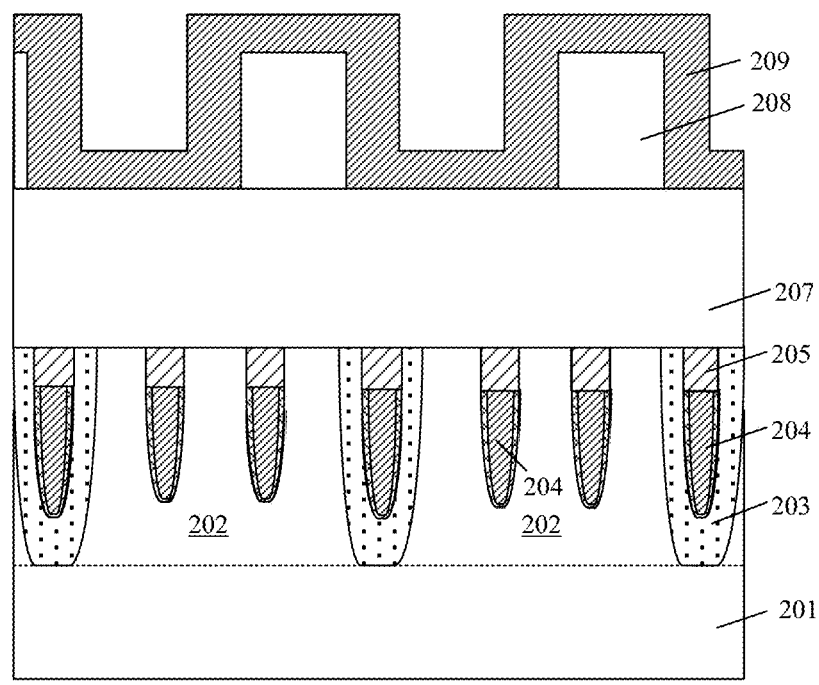
FIG. 8 is an eighth structural schematic diagram of a procedure for forming memory of an embodiment of the disclosure.

Referring to FIG. 7 and FIG. 8, FIG. 7 is performed based on FIG. 5, and FIG. 8 is a schematic diagram of a cross-sectional structure of FIG. 7 along a direction of a cutting line AB. A sidewall material layer 209 is formed on the top and a sidewall surface of the first pattern 208 and on the surface of the hard mask layer 207 between the adjacent first patterns 208.

The material of the sidewall material layer 209 is different from that of the first pattern 208. The material of the sidewall material layer 209 can be one or more of silicon nitride, silicon oxynitride, silicon carbonitride, polysilicon, silicon oxide, amorphous silicon, and amorphous carbon. In the embodiment, the material of the sidewall material layer 209 is silicon oxide.

The sidewall material layer 209 can be formed by an atomic layer deposition process, atmospheric pressure Chemical Vapor Deposition (CVD), Plasma Enhanced Chemical Vapor Deposition (PECVD), Thermal Chemical Vapor Deposition (TCVD), High Density Plasma Chemical Vapor Deposition (HDPCVD) or other suitable processes.

The thickness of the sidewall material layer 209 determines the width (or size) of the opening subsequently formed between the mask patterns and the trench formed in the drain region. The thickness of the sidewall material layer 209 can be adjustable. For example, when the opening between the mask patterns needs to expose the entire surface of the drain region subsequently, the thickness of the sidewall material layer 209 needs to be relatively thick correspondingly. When the opening between the mask patterns only needs to expose a part of the surface of the drain region subsequently, the thickness of the sidewall material layer 209 needs to be relatively thin correspondingly.

The thickness of the sidewall material layer 209 is smaller than the interval between the adjacent first patterns 208. In one embodiment, the thickness of the sidewall material layer 209 is smaller than, equal to, or slightly greater than the size of the drain region along the direction perpendicular to the third direction.

Figure 9:
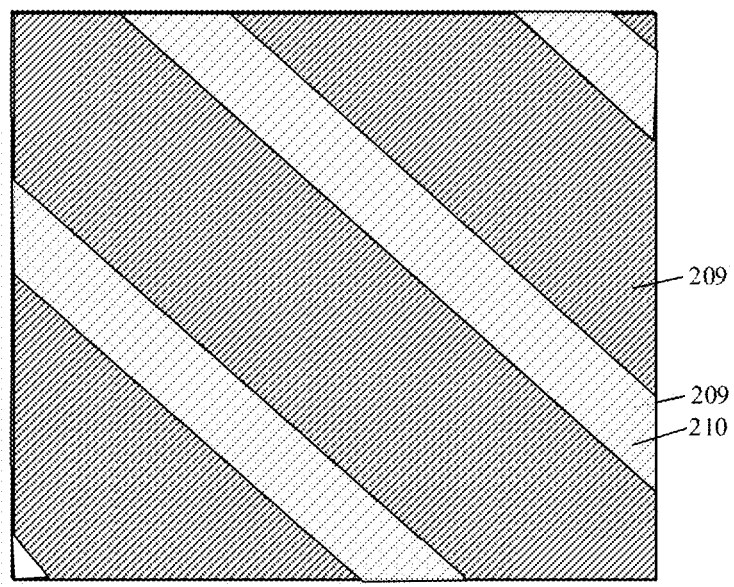
FIG. 9 is a ninth structural schematic diagram of a procedure for forming memory of an embodiment of the disclosure.
Figure 9:
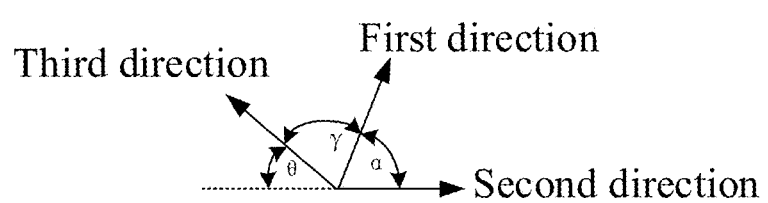
Figure 10:
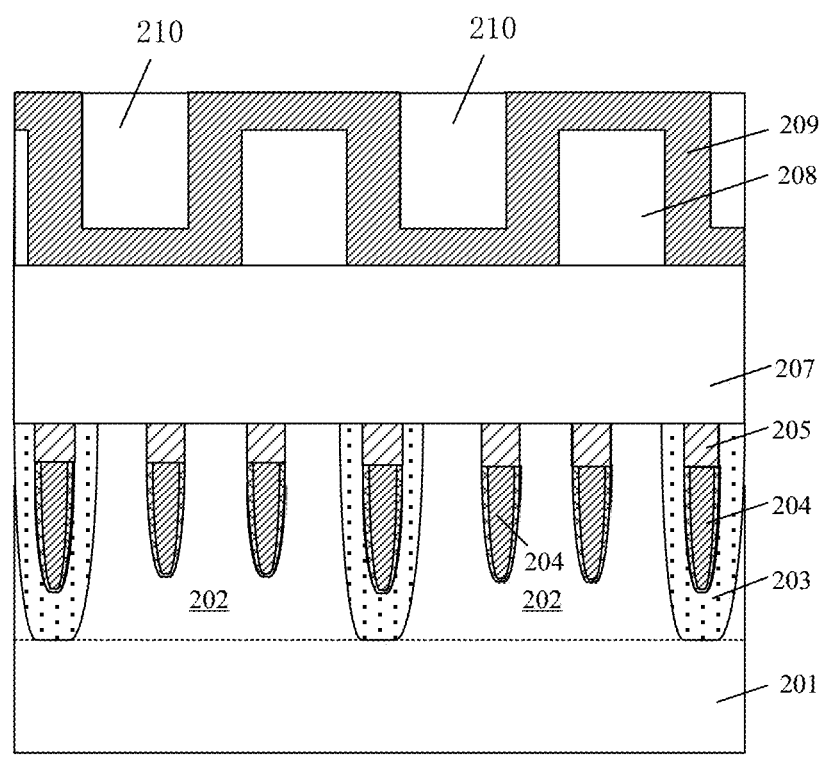
FIG. 10 is a tenth structural schematic diagram of a procedure for forming memory of an embodiment of the disclosure.

Referring to FIG. 9 and FIG. 10, FIG. 9 is performed based on FIG. 7, and FIG. 10 is a schematic diagram of a cross-sectional structure of FIG. 9 along a direction of a cutting line AB. A second pattern 210 is formed on the sidewall material layer 209. The second pattern 210 fills up the space between the first patterns 208.

The material of the second pattern 210 is different from that of the sidewall material layer 209. The material of the second pattern 210 can be one or more of silicon nitride, silicon oxynitride, silicon carbonitride, polysilicon, silicon oxide, amorphous silicon, and amorphous carbon. In the embodiment, the material of the second pattern 210 is silicon nitride.

In one embodiment, the procedure of forming the second pattern 210 includes: a second pattern material layer is formed on the sidewall material layer 209, the second pattern material layer filling up the space between the first patterns 208; and the second pattern material layer on the surface of the sidewall material layer 209 higher than a top surface of the first pattern 208 is removed through planarization, to form the second pattern 210 on the surface of the sidewall material layer 209 between the first patterns 208, the planarization being chemical mechanical polishing.

Figure 11:
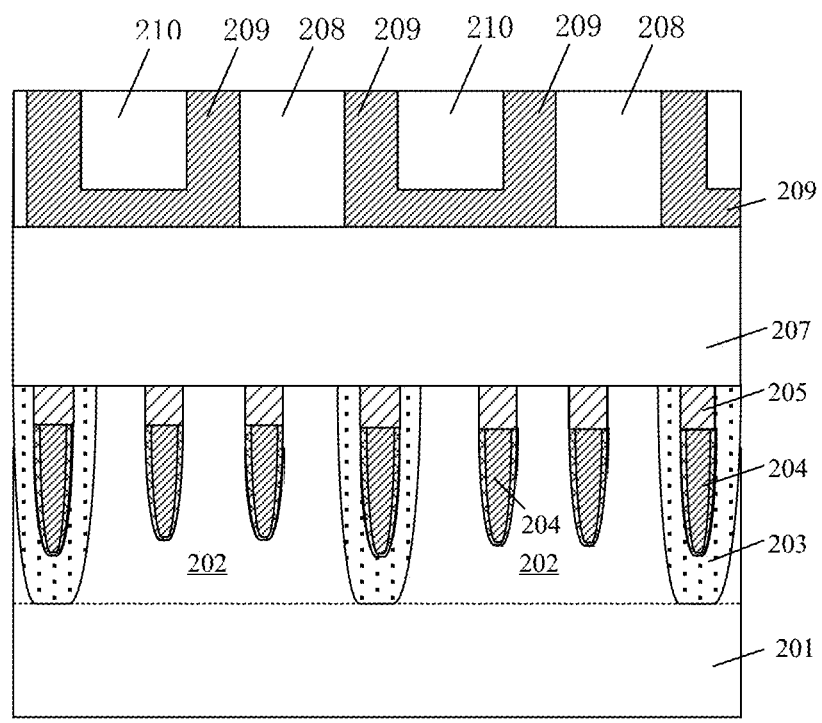
FIG. 11 is an eleventh structural schematic diagram of a procedure for forming memory of an embodiment of the disclosure.

In another embodiment, referring to FIG. 11, after the second pattern material layer on the surface of the sidewall material layer 209 on the top surface of the first pattern 208 is removed through planarization, a planarization process is continued to remove the sidewall material layer and the second pattern material layer higher than the top surface of the first pattern 208 to form the second pattern 210. The remaining sidewall material layer 209 between the sidewall of the first pattern 208 and the sidewall of the second pattern 210 serves as a sidewall. Subsequently, by removing the sidewall, the opening exposing the surface of the hard mask layer can be formed between the first pattern 208 and the second pattern 210. The hard mask layer 207 is etched along the opening, so that the bottom of the opening exposes the surfaces of the plurality of drain regions and the corresponding isolation layers in the third direction. The exposed drain region is etched along the opening to form the trench in the drain region. Therefore, the sidewall defines a width or feature size of the trench subsequently formed in the drain region and defines a position of the trench, and the bitline contact structure is subsequently formed in the trench. Therefore, the sidewall correspondingly defines the width or feature size and the position of the bitline contact structure. Since the thickness of the sidewall material layer 209 formed through deposition can be made very thin, the width or feature size of the bitline contact structure can made very small. When the first pattern 208 and the second pattern 210 are formed, one-time photolithography process and one-time etching process need to be performed when the first pattern 208 is formed. Since the width and feature size of the first pattern 208 are relatively large (not limited to the minimum line width of photolithography), the position accuracy of the formed first pattern 208 are relatively high. The sidewall material layer (the sidewall) is formed on the surface of the sidewall of the first pattern in a self-alignment mode through a deposition process, so that the position accuracy of the formed sidewall material layer (the sidewall) is relatively high and the surface roughness is relatively low. Therefore, the position accuracy of the bitline contact structure is relatively high and the surface roughness is relatively low. The performance of the memory device is improved, and the cost of the process is reduced.

Figure 12:
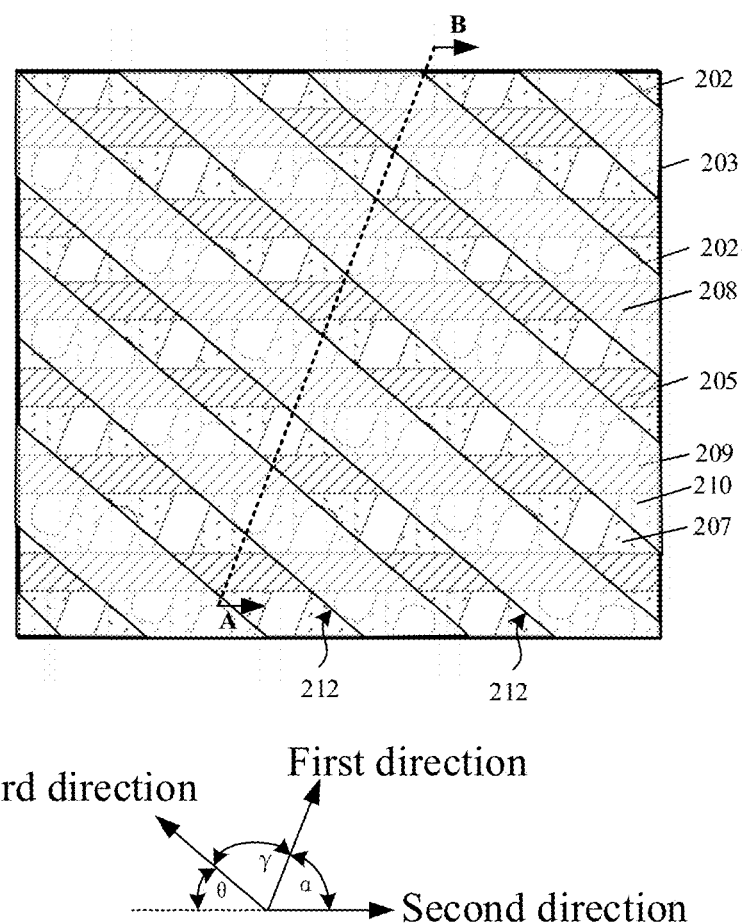
FIG. 12 is a twelfth structural schematic diagram of a procedure for forming memory of an embodiment of the disclosure.
Figure 13:
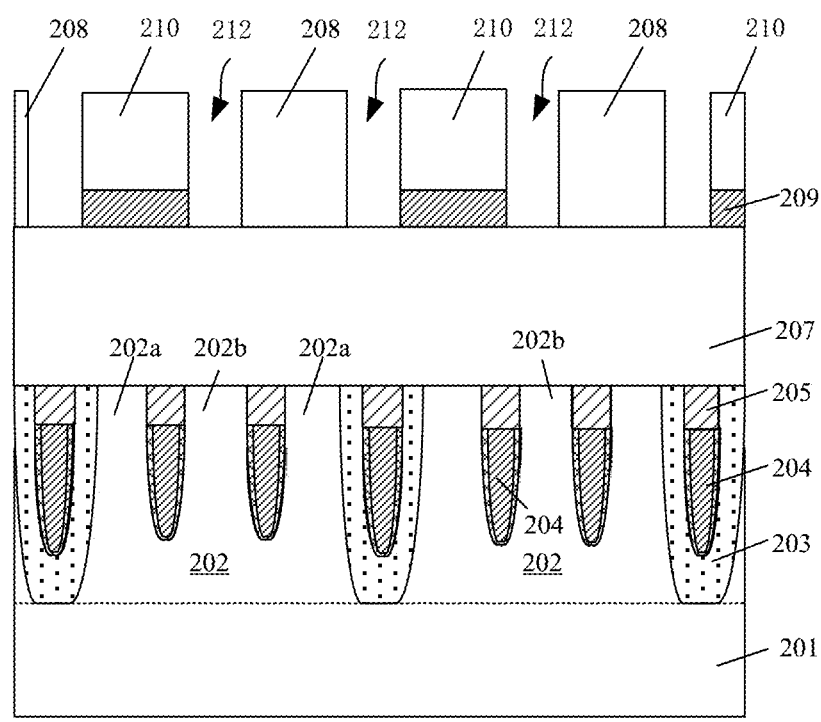
FIG. 13 is a thirteenth structural schematic diagram of a procedure for forming memory of an embodiment of the disclosure.

Referring to FIG. 12 and FIG. 13, FIG. 12 is performed based on FIG. 9, and FIG. 13 is a schematic diagram of a cross-sectional structure of FIG. 12 along a direction of cutting line AB. The sidewall material layer on the top of the first pattern 208 and between the first pattern 208 and the second pattern 210 is removed. The opening 212 between the first pattern 208 and the second pattern 210 is formed. The opening 212 is located above the plurality of the drain regions and the corresponding isolation layers in the third direction.

A chemical mechanical polishing process can be used to remove the sidewall material layer on the top of the first pattern 208, and an anisotropic dry etching process can be used to remove the sidewall material layer (the sidewall) between the first pattern 208 and the second pattern 210.

A plurality of first patterns 208 and second patterns 210 which are parallel and alternately distributed are formed on the hard mask layer 207 by adopting the self-alignment multi-pattern process. The width or feature size of the opening 212 between the adjacent first pattern 208 and second pattern 210 can be relatively small and the surface roughness is relatively low. When the hard mask layer 207 at the bottom of the opening 212 and the drain region are subsequently etched along the opening 212 to form the trench in the drain region, the width or feature size of the trench formed in the drain region will also be relatively small correspondingly and the surface roughness will be relatively low. Therefore, the width or feature size of the bitline contact structure formed in the trench will also be relatively small and the surface roughness will be relatively low. Therefore, the performance of the memory device is improved.

The formed plurality of first patterns 208 and second patterns 210 which are parallel and alternately distributed, and the opening 212 between the first pattern 208 and the second pattern 210 extend in the third direction. A second acute angle γ is provided between the third direction and the first direction (or the second acute angle γ is provided between an extension direction of the mask pattern (the first pattern 208 and the second pattern 210) and the extension direction of the active region 202). A third acute angle θ is provided between the third direction and the second direction (or the third acute angle θ is provided between the extension direction of the mask pattern (the first pattern 208 and the second pattern 210) and the extension direction of the word line 204). The second acute angle γ is greater than the first acute angle α and the third acute angle θ. The sum of the first acute angle α, the second acute angle γ and the third acute angle θ is 180 degrees. Therefore, an included angle between the extension direction of the active region 202 and the extension direction of the opening 212 is sufficiently large. When the hard mask layer 207 and the drain region are etched subsequently along the opening 212 to form the trench 213 (referring to FIG. 14 and FIG. 15) with a width and a position corresponding to the opening 212 in the drain region, the trench 213 (referring to FIG. 14 and FIG. 15) with the same width or the same feature size can expose sufficiently large drain area of the drain region 202b, that is, the width or feature size of the trench 213 and the bitline contact structure formed in the trench 213 can be more flexible, therefore, a capacitor region (the source region 202a and a corresponding region above the source region 202a) is protected from being etched in a procedure of forming the opening 212 and the trench 213, and the opening 212 and the trench 213 can maintain the relatively small width or feature size.

In one embodiment, the first acute angle α ranges from 60 degrees to 75 degrees and can be 60 degrees, 61 degrees, 62 degrees, 63 degrees, 64 degrees, 65 degrees, 66 degrees, 67 degrees, 68 degrees, 69 degrees, 70 degrees, 71 degrees, 72 degrees, 73 degrees, 74 degrees, and 75 degrees. The second acute angle γ ranges from 65 degrees to 85 degrees and can be 65 degrees, 66 degrees, 67 degrees, 68 degrees, 69 degrees, 70 degrees, 71 degrees, 72 degrees, 73 degrees, 74 degrees, 75 degrees, 76 degrees, 77 degrees, 78 degrees, 79 degrees, 80 degrees, 81 degrees, 82 degrees, 83 degrees, 84 degrees, and 85 degrees. The third acute angle θ ranges from 35 degrees to 45 degrees and can be 35 degrees, 36 degrees, 37 degrees, 38 degrees, 39 degrees, 40 degrees, 41 degrees, 42 degrees, 43 degrees, 44 degrees, and 45 degrees. The flexibility in the width or feature size of the bitline contact structure formed in the trench 213 and the trench 213 is further improved through the foregoing specific angle setting, therefore, a capacitor region is better protected from being etched in a procedure of forming the opening 212 and the trench 213, and the width or feature size of the opening 212 and trench 213 can be smaller.

Referring to FIG. 14 and FIG. 15, FIG. 14 is performed based on FIG. 12, and FIG. 15 is a schematic diagram of a cross-sectional structure of FIG. 14 along a direction of a cutting line AB. By taking the plurality of first patterns 208 and second patterns 210, which are parallel and alternately distributed, as masks, the hard mask layer 207 (referring to FIG. 13) is etched along the opening 212, so that the bottom of the opening 212 exposes the surfaces of the plurality of drain regions 202b and the corresponding isolation layers 203 (and the isolation protective layers 205) in the third direction. The remaining hard mask layers on the two sides of the opening 212 are the adjacent mask patterns 217. Using the plurality of parallel mask patterns 217 as masks, the drain region 202b and the corresponding isolation layer 203 are etched along the opening 212 to form a plurality of parallelly distributed trenches 213 in the drain region 202b and the corresponding isolation layer 203.

The hard mask layer 207 is etched by adopting an anisotropic dry etching process. When the hard mask layer 207 is etched along the opening 212 so that the bottom of the opening 212 exposes the surfaces of the plurality of the drain regions 202b and the corresponding isolation layers 203 (and the isolation protective layer 205) in the third direction, the etching rate of the active region (the drain region 202b) and the hard mask layer 207 is greater than the etching rate of the isolation protective layer 205. In some embodiments, the etching selection ratio of the hard mask layer relative to the isolation protective layer is 5:1-15:1, such that the etching amount of the isolation protective layer 205 is very small or negligible when the etching hard mask layer is etched, and the formed trench 213 will not expose the word line 204.

In one embodiment, when the trench 213 is formed, the etching selection ratio of the active region (the drain region 202b) relative to the isolation protective layer 205 is 5:1-15:1, so that the etching amount of the isolation protective layer 205 is very little or negligible when the trench 213 is formed, and the formed trench 213 will not expose the word line 204.

Figure 16:
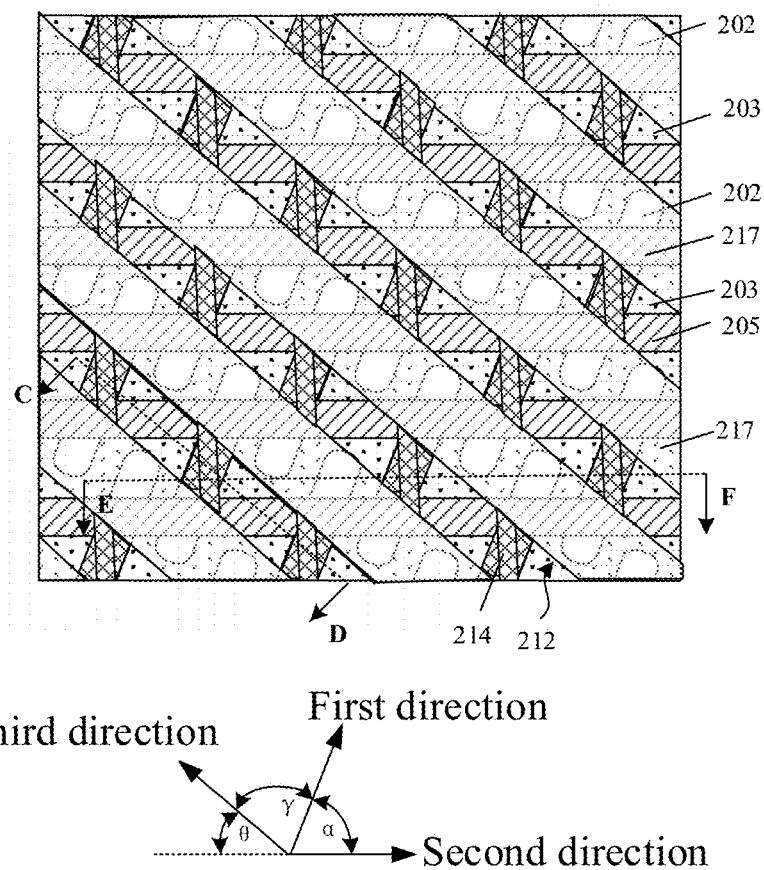
FIG. 16 is a sixteenth first structural schematic diagram of a procedure for forming memory of an embodiment of the disclosure.
Figure 17:
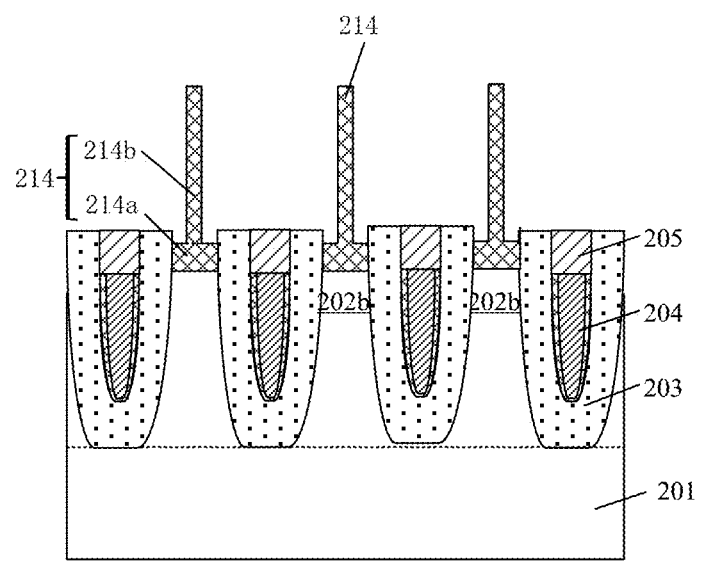
FIG. 17 is a seventeenth structural schematic diagram of a procedure for forming memory of an embodiment of the disclosure.
Figure 18:
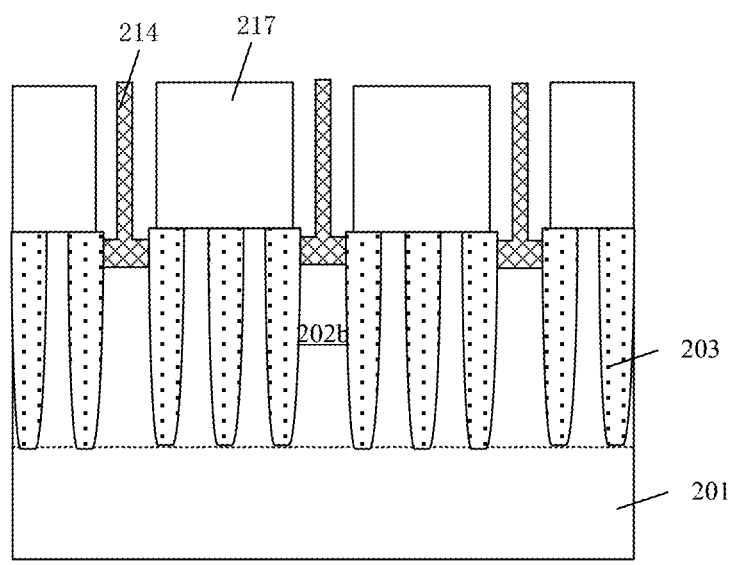
FIG. 18 is an eighteenth structural schematic diagram of a procedure for forming memory of an embodiment of the disclosure.

Referring to FIG. 16, FIG. 17 and FIG. 18, FIG. 16 is performed based on FIG. 14, and FIG. 17 is a schematic diagram of a cross-sectional structure of FIG. 16 along a direction of a cutting line CD. The trench 213 (referring to FIG. 15) is filled with a conductive layer to form a strip-shaped bitline contact structure. The strip-shaped bitline contact structure is broken to form a plurality of bitline contact blocks 214 connected to the corresponding drain regions 202b.

The material of the conductive layer is doped polysilicon (such as polysilicon doped with N-type impurity ions) or metal (for example, one or more of tungsten (W), aluminum (Al), copper (Cu), titanium (Ti), silver (Ag), gold (Au), platinum (Pt), and nickel (Ni)). The surface of the conductive layer can be flush with that of the active region 202 or higher than that of the active region 202. In one embodiment, both the trench 213 in the drain region 202b and the opening 212 between the mask patterns 217 are filled with the conductive layer, that is, a part of the formed strip-shaped bitline contact structure is located in the trench 213, and the other part thereof is located in the opening 212.

The strip-shaped bitline contact structure is broken through an etching process to form the bitline contact blocks 214. The formed bitline contact block 214 includes a first part 214a and a second part 214b located on the first part 214a. The first part 214a is embedded in the trench formed in the drain region 202b. The second part 214b protrudes from the surface of the first part 214a. The second part 214b extends along the direction perpendicular to the second direction. A width of the second part 214b in the second direction (or the third direction) is smaller than that of the first part 214a in the second direction (or the third direction), therefore, the first part 214a with relatively large size is embedded in the drain region 202b, relatively large contact area between the first part and the drain region is maintained, and resistance is reduced. When the second part 214b with relatively small size is subsequently connected with the formed bitline, the size of the bitline can also be relatively small, the integration level can be improved, and parasitic capacitance between adjacent bitline contact blocks 214 is reduced. In some embodiments, when the strip-shaped bitline contact structure is broken, a patterned mask layer needs to be formed on the substrate first. The plurality of openings extending in the direction perpendicular to the second direction are provided in the mask layer. The opening exposes the bitline contact structure (the conductive layer) on both sides of the plurality of drain regions distributed in the direction perpendicular to the second direction. The bitline contact structure (the conductive layer) on the isolation layer 203 and the isolation protective layer 205 is etched away along the opening, and then the bitline contact structure (the conductive layer) in a part of the active region may also be etched away to form the bitline contact blocks 214.

Figure 19:
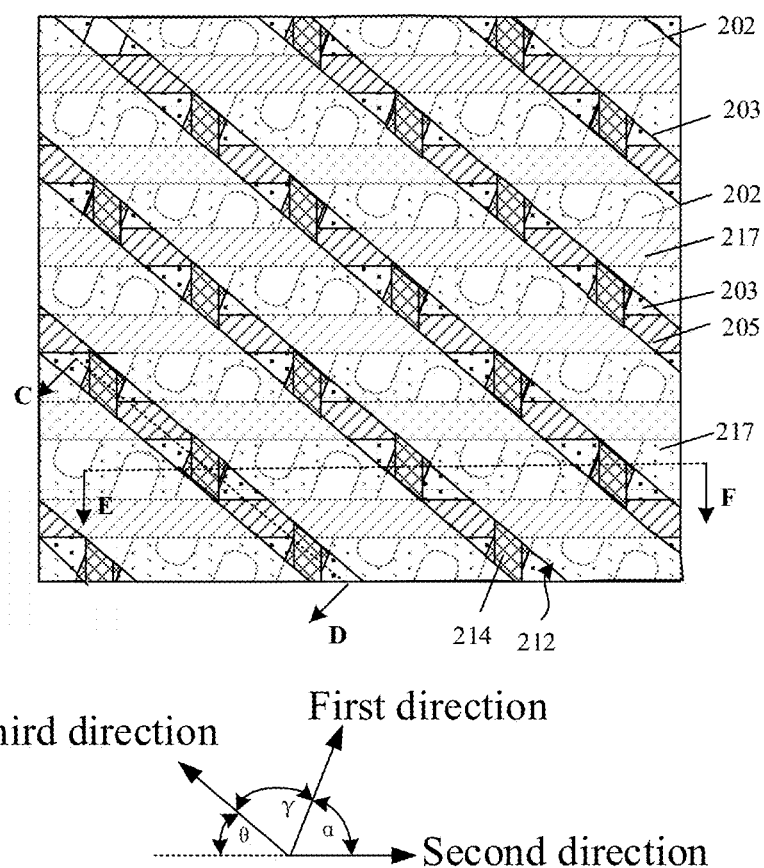
FIG. 19 is a nineteenth structural schematic diagram of a procedure for forming memory of an embodiment of the disclosure.
Figure 20:
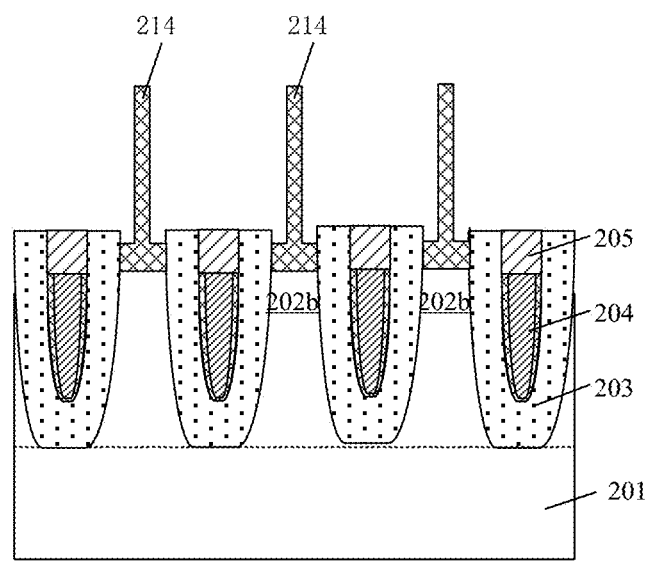
FIG. 20 is a twentieth structural schematic diagram of a procedure for forming memory of an embodiment of the disclosure.
Figure 21:
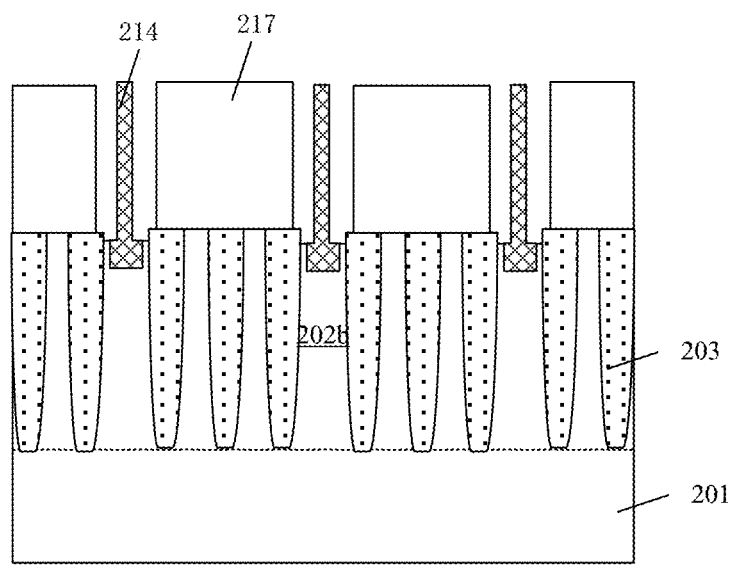
FIG. 21 is a twenty-first structural schematic diagram of a procedure for forming memory of an embodiment of the disclosure.
Figure 22:
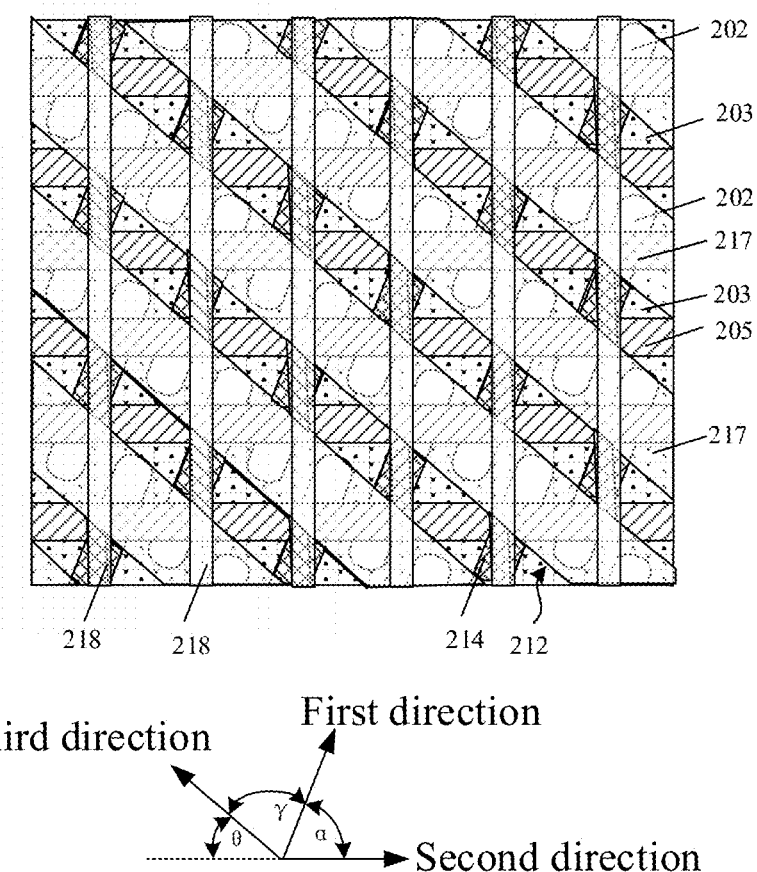
FIG. 22 is a twenty-second structural schematic diagram of a procedure for forming memory of an embodiment of the disclosure.

FIG. 16, FIG. 17 and FIG. 18 are the bitline contact blocks 214 formed when the size of the opening 212 between the mask patterns 217 and the size of the trench formed in the drain region 202b are relatively large. FIG. 19, FIG. 20 and FIG. 21 the bitline contact blocks 214 formed when the size of the opening 212 between the mask patterns 217 and the size of the trench formed in the drain region 202b are relatively small. Referring to FIG. 22, after the bitline contact block 214 is formed, the operation that a bitline 218 connecting a plurality of bitline contact blocks 214 is formed along the direction perpendicular to the second direction is further included.

In one embodiment, the forming procedure of the bitline 218 includes: an interlayer dielectric layer (not shown in the figure) is formed on the semiconductor substrate, and the plurality of parallel openings are formed in the interlayer dielectric layer, each opening extending along the direction perpendicular to the second direction and correspondingly exposing a part of the surfaces of the plurality of bitline contact blocks 214 arranged in the direction perpendicular to the second direction; and the bitline 218 is formed.

One embodiment of the disclosure further provides a memory device, referring to FIG. 14 and FIG. 15, including:

a semiconductor substrate 201 is provided. A plurality of discrete active regions 202 extending along a first direction are formed in the semiconductor substrate 201. The plurality of active regions 202 are isolated by an isolation layer 203. Two parallel word lines 204 extending along a second direction are formed in each active region 202 and the corresponding isolation layer 203. Each active region 202 is divided by the two word lines 204 into a drain region 202b located between the two word lines 204 and source regions 202a respectively located outside of the word lines 204. A first acute angle α is provided between the first direction and the second direction.

The plurality of parallel mask patterns 217 extending along a third direction are formed on the semiconductor substrate 201. The mask pattern 217 is formed by adopting a self-alignment multi-pattern process. An opening 212 is provided between the adjacent mask patterns 217. The opening 212 exposes the surfaces of a plurality of drain regions 202b and the corresponding isolation layers 203 in the third direction. The mask patterns 217 serve as masks when the drain region 202b and the corresponding isolation layer 203 are subsequently etched to form a plurality of parallelly distributed trenches 213 in the drain region 202b and the corresponding isolation layer 203.

In one embodiment, a second acute angle γ is provided between the third direction and the first direction, a third acute angle θ is provided between the third direction and the second direction, and the second acute angle θ is greater than the first acute angle α and the third acute angle θ. The sum of the first acute angle α, the second acute angle γ and the third acute angle θ is 180 degrees.

In one embodiment, the first acute angle α ranges from 60 degrees to 75 degrees, the second acute angle γ ranges from 65 degrees to 80 degrees, and the third acute angle θ ranges from 35 degrees to 45 degrees.

In one embodiment, the first acute angle α is 69 degrees, the second acute angle γ is 70 degrees, and the third acute angle θ is 41 degrees.

In one embodiment, the surface of the word line 204 is lower than those of the drain region 202b and the source region 202a. An isolation protective layer 205 is provided on the surface of the word line 204. The surface of the isolation protective layer 205 is flush with or higher than those of the drain region 202b and the source region 202a.

In one embodiment, when the trench is subsequently formed, the etching rate of the active region 202 is greater than that of the isolation protective layer 205.

The surface of the formed bitline contact block 214 can be flush with that of the active region 202 or higher than that of the active region 202.

It is to be noted that the definition or description of the same or similar structure in the embodiment (the memory device) as in the foregoing embodiment (the forming procedure of the memory device) will not be repeated in the embodiment, and specific reference should be made to the definition or description of corresponding parts in the foregoing embodiment.

Although the embodiments of the disclosure have been disclosed above in terms of exemplary embodiments, the exemplary embodiments are not intended to limit the embodiments of the disclosure. Possible variations and modifications of the technical solutions of the embodiments of the disclosure can be made by those skilled in the art through utilization of the above disclosed method and technical content without departing from the spirit and scope of the embodiments of the disclosure. Therefore, any simple modifications, equivalent variations, and modifications of the above embodiments according to the technical essence of the embodiments of the disclosure without departing from the content of the technical solutions of the embodiments of the disclosure fall within the protection scope of the technical solutions of the embodiments of the disclosure.

What is claimed is:

1. A method for forming a memory device, comprising:
providing a semiconductor substrate, forming a plurality of discrete active regions extending along a first direction in the semiconductor substrate, the plurality of active regions being isolated by an isolation layer, forming two parallel word lines extending along a second direction in each active region and a corresponding isolation layer, the two parallel word lines dividing each active region into a drain region located between the two parallel word lines and source regions located outside of the word lines respectively, and a first acute angle being provided between the first direction and the second direction;
forming a plurality of parallel mask patterns extending along a third direction on the semiconductor substrate by adopting a self-alignment multi-pattern process, providing an opening between the adjacent mask patterns, the opening exposing surfaces of a plurality of the drain regions and corresponding isolation layers in the third direction;
using the plurality of parallel mask patterns as masks, etching the drain region and the corresponding isolation layer along the opening to form a plurality of parallelly distributed trenches in the drain region and the corresponding isolation layer;
filling the trench with a conductive layer to form a strip-shaped bitline contact structure;
breaking the strip-shaped bitline contact structure to form a plurality of bitline contact blocks connected with corresponding drain regions; and
forming a bitline connecting the plurality of bitline contact blocks along a direction perpendicular to the second direction.

2. The method for forming a memory device of claim 1, wherein a second acute angle is provided between the third direction and the first direction.

3. The method for forming a memory device of claim 2, wherein a third acute angle is provided between the third direction and the second direction, the second acute angle being greater than the first acute angle and the third acute angle, and the sum of the first acute angle, the second acute angle, and the third acute angle being 180 degrees.

4. The method for forming a memory device of claim 3, wherein the first acute angle ranges from 60 degrees to 75 degrees, the second acute angle ranges from 65 degrees to 85 degrees, and the third acute angle ranges from 35 degrees to 45 degrees.

5. The method for forming a memory device of claim 4, wherein the first acute angle is 69 degrees, the second acute angle is 70 degrees, and the third acute angle is 41 degrees.

6. The method for forming a memory device of claim 1, wherein said forming a plurality of parallel mask patterns extending along a third direction on the semiconductor substrate by adopting a self-alignment multi-pattern process, providing an opening between the adjacent mask patterns, the opening exposing surfaces of a plurality of the drain regions and corresponding isolation layers in the third direction comprises:
    forming a hard mask layer on the substrate, and forming a plurality of parallel first patterns extending along the third direction on the hard mask layer;
    forming a sidewall material layer on the top and a sidewall surface of the first pattern and on the surface of the hard mask layer between the adjacent first patterns;
    forming a second pattern on the sidewall material layer, the second pattern filling up the space between the first patterns;
    removing the sidewall material layer on the top of the first pattern and between the first pattern and the second pattern, and forming the opening between the first pattern and the second pattern; and
    etching the hard mask layer along the opening, thus the bottom of the opening exposes the surfaces of the plurality of drain regions and the corresponding isolation layers in the third direction, and the remaining of the hard mask layers on both sides of the opening are the adjacent mask patterns.

7. The method for forming a memory device of claim 6, wherein when etching the hard mask layer along the opening, an etching rate of the drain region and the hard mask layer is greater than that of the isolation protective layer.

8. The method for forming a memory device of claim 7, wherein the isolation protective layer is provided on the surface of the word line, when forming the trench, an etching selection ratio of the drain region to the isolation protective layer being 5:1-15:1.

9. The method for forming a memory device of claim 6, wherein a material of the second pattern is at least one of: silicon oxynitride, silicon carbonitride, polysilicon, silicon oxide, amorphous silicon, and amorphous carbon.

10. The method for forming a memory device of claim 6, wherein a material of the second pattern is different from a material of the sidewall material layer.

11. The method for forming a memory device of claim 6, wherein the sidewall material layer is formed by one of following processes:
    an atomic layer deposition process, atmospheric pressure chemical vapor deposition, plasma enhanced chemical vapor deposition, a thermal chemical vapor deposition method, or a high-density plasma chemical vapor deposition process.

12. The method for forming a memory device of claim 6, wherein a thickness of the sidewall material layer is smaller than an interval between adjacent first patterns.

13. The method for forming a memory device of claim 1, wherein the forming of the bitline contact block includes a first part and a second part located on the first part, the first part being embedded in the trench formed in the drain region, the second part protruding from the surface of the first part, the second part extending along a direction perpendicular to the second direction, and a width of the second part in the second direction or the third direction being smaller than the width of the first part in the second direction or the third direction.

14. The method for forming a memory device of claim 1, wherein a material of the conductive layer is one of following:
    doped polysilicon, tungsten, aluminum, copper, titanium, silver, gold, platinum, and nickel.

15. The method for forming a memory device of claim 1, wherein a surface of the conductive layer is flush with a surface of the active region or higher than the surface of the active region.

16. A memory device, comprising:
    a semiconductor substrate, a plurality of discrete active regions extending along a first direction being formed in the semiconductor substrate, the plurality of active regions being isolated by an isolation layer, two parallel word lines extending along a second direction being formed in each active region and the corresponding isolation layer, the two word lines dividing each active region into a drain region located between the two word lines and source regions located outside of the word lines respectively, and a first acute angle being provided between the first direction and the second direction; and
    a plurality of parallel mask patterns extending along a third direction being formed on the semiconductor substrate, the mask pattern being formed by adopting a self-alignment multi-pattern process, an opening being provided between the adjacent mask patterns, the opening exposing the surfaces of a plurality of the drain regions and the corresponding isolation layers in the third direction, and the mask patterns serving as masks when the drain region and the corresponding isolation layer are subsequently etched, and a plurality of parallelly distributed trenches are formed in the drain region and the corresponding isolation layer.

17. The memory device of claim 16, wherein a second acute angle is provided between the third direction and the first direction, a third acute angle being provided between the third direction and the second direction, the second acute angle being greater than the first acute angle and the third acute angle, and the sum of the first acute angle, the second acute angle, and the third acute angle being 180 degrees.

18. The memory device of claim 17, wherein the first acute angle ranges from 60 degrees to 75 degrees, the second acute angle ranges from 65 degrees to 85 degrees, and the third acute angle ranges from 35 degrees to 45 degrees.

19. The memory device of claim 16, wherein a surface of the word line is lower than a surfaces of the drain region and the source region, an isolation protective layer being provided on the surface of the word line, and a surface of the isolation protective layer being flush with surfaces of the drain region and the source region or higher than the surfaces of the drain region and the source region.

20. The memory device of claim 19, wherein when forming the trench, an etching rate of the active region is greater than an etching rate of the isolation protective layer.

* * * * *